United States Patent
Watanabe et al.

(10) Patent No.: US 8,736,295 B2
(45) Date of Patent: May 27, 2014

(54) SEMICONDUCTOR TESTING CIRCUIT, SEMICONDUCTOR TESTING JIG, SEMICONDUCTOR TESTING APPARATUS, AND SEMICONDUCTOR TESTING METHOD

(75) Inventors: Yuichi Watanabe, Yokohama (JP); Kiyotaka Shinada, Yokohama (JP); Yuushin Kimura, Yokohama (JP); Shigeru Goto, Yokohama (JP); Yasuhiko Tandou, Yokohama (JP); Eiji Takada, Kawasaki (JP); Kouji Uesaka, Kawasaki (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 934 days.

(21) Appl. No.: 12/873,738

(22) Filed: Sep. 1, 2010

(65) Prior Publication Data

US 2011/0057681 A1 Mar. 10, 2011

(30) Foreign Application Priority Data

Sep. 4, 2009 (JP) ................................. 2009-204549

(51) Int. Cl.
*G01R 31/26* (2006.01)

(52) U.S. Cl.
USPC ................. 324/762.01; 324/73.1; 324/756.01

(58) Field of Classification Search
USPC ........................................ 324/756.04, 762.01
See application file for complete search history.

(56) References Cited

U.S. PATENT DOCUMENTS

| | | | |
|---|---|---|---|
| 6,189,120 B1 * | 2/2001 | Akram | 714/724 |
| 6,275,962 B1 * | 8/2001 | Fuller et al. | 714/724 |
| 6,498,473 B1 * | 12/2002 | Yamabe | 324/750.01 |
| 6,557,128 B1 * | 4/2003 | Turnquist | 714/724 |
| 6,628,137 B2 * | 9/2003 | Mori et al. | 324/762.02 |
| 6,714,888 B2 * | 3/2004 | Mori et al. | 702/120 |
| 6,804,620 B1 * | 10/2004 | Larson et al. | 702/91 |
| 6,842,031 B2 * | 1/2005 | Koh et al. | 324/756.02 |
| 7,096,396 B2 * | 8/2006 | Uesaka et al. | 714/725 |
| 7,199,604 B2 * | 4/2007 | Hecht et al. | 326/30 |
| 7,262,627 B2 * | 8/2007 | Yamane et al. | 324/762.01 |
| 8,310,270 B2 * | 11/2012 | Gohel et al. | 324/764.01 |
| 2006/0279310 A1 * | 12/2006 | Walker et al. | 324/765 |

FOREIGN PATENT DOCUMENTS

JP 2004-361111 A 12/2004

\* cited by examiner

*Primary Examiner* — Minh N Tang
(74) *Attorney, Agent, or Firm* — Westerman, Hattori, Daniels & Adrian, LLP

(57) ABSTRACT

A signal processing section included in a semiconductor testing circuit supplies a test signal inputted from a tester via a signal line to a plurality of DUTs and generates a test result by synthesizing response signals transmitted from the plurality of DUTs on the basis of the test signal. A test result output section included in the semiconductor testing circuit makes a voltage level of the test result differ from a voltage level of the test signal inputted and outputs the test result to the tester via the signal line.

9 Claims, 14 Drawing Sheets

US 8,736,295 B2

SEMICONDUCTOR TESTING CIRCUIT, SEMICONDUCTOR TESTING JIG, SEMICONDUCTOR TESTING APPARATUS, AND SEMICONDUCTOR TESTING METHOD

CROSS-REFERENCE TO RELATED APPLICATION

This application is based upon and claims the benefit of priority of the prior Japanese Patent Application No. 2009-204549, filed on Sep. 4, 2009, the entire contents of which are incorporated herein by reference.

FIELD

The embodiments discussed herein are related to a semiconductor testing circuit, a semiconductor testing jig, a semiconductor testing apparatus, and a semiconductor testing method.

BACKGROUND

A plurality of semiconductor integrated circuits are tested simultaneously by the use of a tester in order to reduce costs and test time.

The tester includes a pin electronics section for transmitting a signal to and receiving a signal from a device under test (hereinafter abbreviated as a "DUT"). The number of DUTs simultaneously tested depends on the number of channels of the pin electronics section and the number of signal terminals of each DUT. The number of DUTs simultaneously tested is given by (number of channels of pin electronics section)/number of signal terminals of each DUT).

As can be seen from the above relationship, the number of DUTs simultaneously tested decreases as the number of signal terminals of a semiconductor integrated circuit used as each DUT increases. In addition, if the number of channels of the tester is small, the number of DUTs simultaneously tested is small. A decrease in the number of DUTs simultaneously tested leads to lower test throughput, longer test time, higher test costs, and the like.

Accordingly, for example, the number of testers is increased or the number of channels of a pin electronics section included in a tester is increased. However, such a technique requires that an installation area should be ensured, or leads to higher costs.

Therefore, the following technique has traditionally been used. An intermediate board is placed between a tester and a plurality of DUTs. A signal from the tester is inputted to input terminals of the plurality of DUTs by the use of the intermediate board. By doing so, the number of DUTs simultaneously tested can be increased.

By the way, recent semiconductor integrated circuits, such as SoC (System on Chip) devices, use various interfaces with a plurality of devices. In many cases, an input-output terminal (also referred to as a "bus terminal") which is a two-way interface is used.

Japanese Laid-open Patent Publication No. 2004-361111

However, the use of an input-output terminal requires that switching between an input signal and an output signal should be performed. Accordingly, it is necessary, for example, to use an input signal line and an output signal line between a tester and an intermediate board. As a result, channels of the tester are used for this purpose and it is difficult to increase the number of DUTs simultaneously tested.

SUMMARY

According to an aspect of the present invention, there is provided a semiconductor testing circuit including a signal processing section which supplies a test signal inputted from a tester via a signal line to a plurality of devices under test and which generates a test result by synthesizing response signals transmitted from the plurality of devices under test on the basis of the test signal and a test result output section which makes a voltage level of the test result differ from a voltage level of the test signal and which outputs the test result to the tester via the signal line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
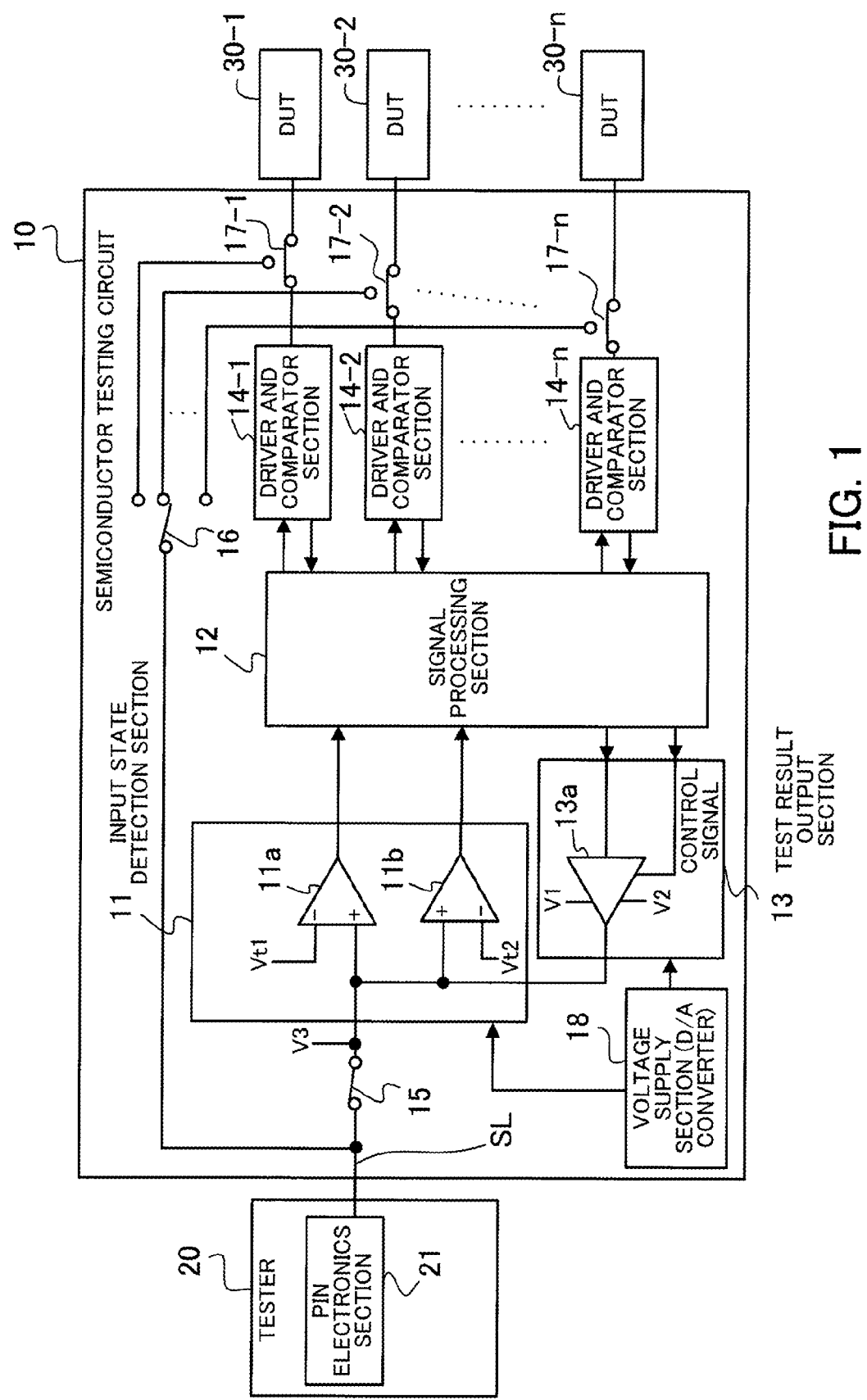
FIG. 1 illustrates the structure of a semiconductor testing circuit according to an embodiment.

Embodiments of the present invention will now be described with reference to the accompanying drawings, wherein like reference numerals refer to like elements throughout.

FIG. 1 illustrates the structure of a semiconductor testing circuit according to an embodiment.

A semiconductor testing circuit 10 is placed between a pin electronics section 21 of a tester 20 and, for example, DUTs 30-1, 30-2, ..., and 30-*n* (n is a natural number greater than or equal to two) which are semiconductor integrated circuits to be tested.

The semiconductor testing circuit 10 includes an input state detection section 11, a signal processing section 12, a test result output section 13, and driver and comparator sections 14-1, 14-2, ..., and 14-*n*. In addition, the semiconductor testing circuit 10 includes switches 15, 16, 17-1, 17-2, ..., and 17-*n* and a voltage supply section 18.

The input state detection section 11 compares the voltage level of a signal line SL connected to the pin electronics section 21 of the tester 20 with a threshold and detects whether the input state detection section 11 is in a state in which a test signal is inputted.

For example, the input state detection section 11 includes two comparators 11*a* and 11*b*. Voltage Vt1 is applied to a negative input terminal of the comparator 11*a* as a threshold. When the switch 15 is "on," a positive input terminal of the comparator 11*a* is electrically connected to the signal line SL. When the voltage level of the signal line SL exceeds the voltage Vt1, the comparator 11*a* determines that the input state detection section 11 is in an input state in which the test signal "1" is inputted, and outputs "1" to the signal processing section 12. On the other hand, when the switch 15 is "on," a positive input terminal of the comparator 11*b* is connected to the signal line SL. Voltage Vt2 is applied to a negative input terminal of the comparator 11*b* as a threshold. When the voltage level of the signal line SL falls below the voltage Vt2, the comparator 11*b* determines that the input state detection section 11 is in an input state in which the test signal "0" is inputted, and outputs "0" to the signal processing section 12.

By using the above the input state detection section 11, whether the input state detection section 11 is in an input state in which a test signal is inputted can be detected according to the voltage level of the signal line SL.

On the basis of the result of detection by the input state detection section 11, the signal processing section 12 outputs a test signal based on the voltage level of the signal line SL to the DUTs 30-1 through 30-*n* side. For example, when "1" is outputted from the comparator 11*a* of the input state detection section 11, the signal processing section 12 supplies "1" as a test signal to the DUTs 30-1 through 30-*n* via the driver and comparator sections 14-1 through 14-*n* respectively. For example, when "0" is outputted from the comparator 11*b* of the input state detection section 11, the signal processing section 12 supplies "0" as a test signal to the DUTs 30-1 through 30-*n* via the driver and comparator sections 14-1 through 14-*n* respectively.

In addition, the signal processing section 12 receives response signals transmitted from the DUTs 30-1 through 30-*n* on the basis of the supplied test signal via the driver and comparator sections 14-1 through 14-*n*, respectively, synthesizes them into a test result, and outputs it to the tester 20 side. For example, if all the response signals transmitted from the DUTs 30-1 through 30-*n* are "1," then the signal processing section 12 outputs the test result "1" as a value obtained by synthesizing them. If all the response signals transmitted from the DUTs 30-1 through 30-*n* are "0," then the signal processing section 12 outputs the test result "0" as a value obtained by synthesizing them. If at least one of the response signals transmitted from the DUTs 30-1 through 30-*n* differ from the rest, then the signal processing section 12 outputs, for example, the test result "HiZ (high impedance)."

For example, the signal processing section 12 has the following structure.

Figure 2:
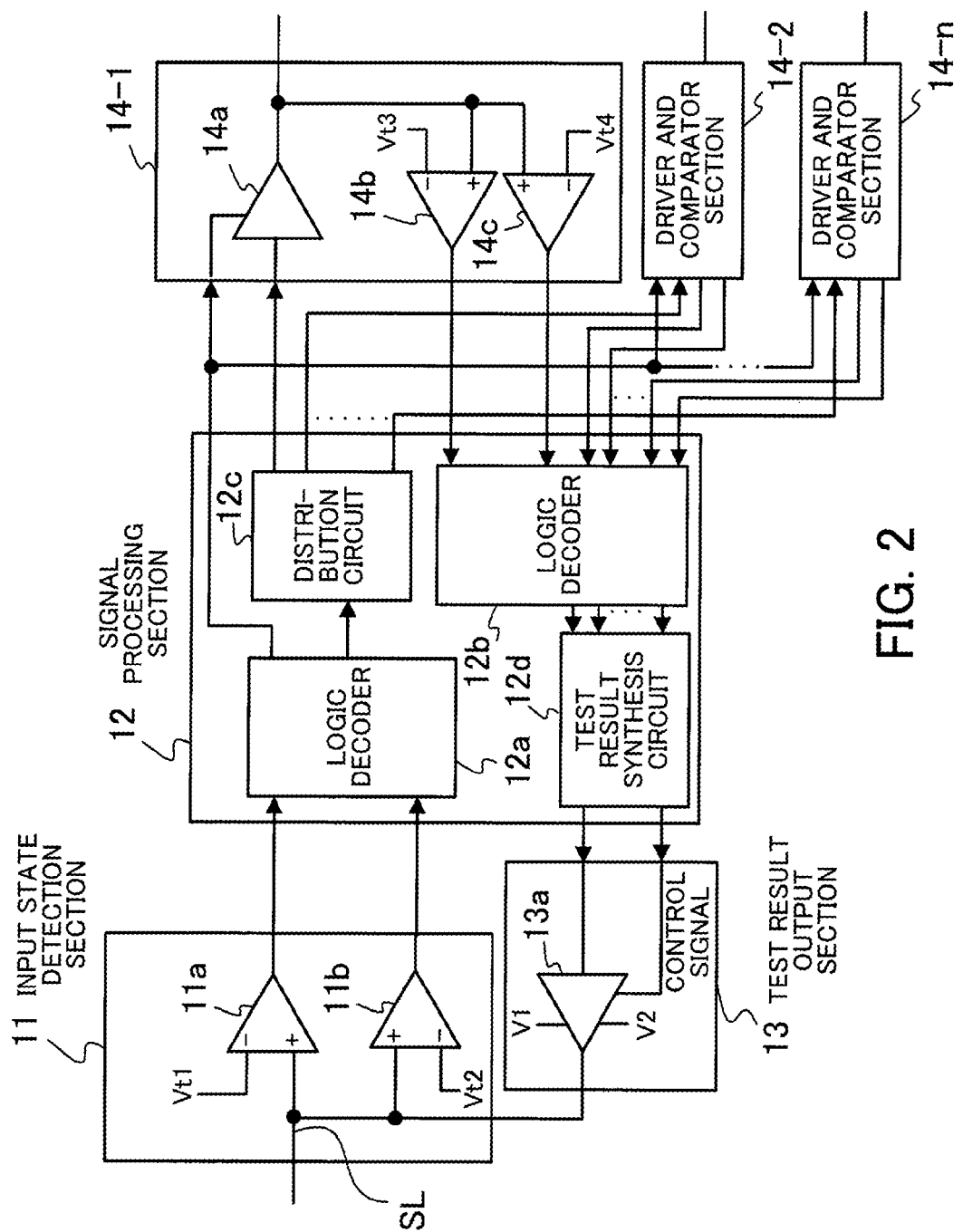
FIG. 2 illustrates an example of the structure of a signal processing section.

FIG. 2 illustrates an example of the structure of the signal processing section.

In FIG. 2, an example of the structure of the driver and comparator section 14-1 is also illustrated. The structure of the other driver and comparator sections 14-2 through 14-*n* is the same as that of the driver and comparator section 14-1 and is not illustrated.

For example, the signal processing section 12 includes logic decoders 12*a* and 12*b*, a distribution circuit 12*c*, and a test result synthesis circuit 12*d*.

The logic decoder 12*a* determines a test signal from the tester 20 on the basis of outputs from the input state detection section 11. For example, if both of the outputs from the comparators 11*a* and 11*b* of the input state detection section 11 are "1," then the logic decoder 12*a* determines that "1" is inputted as a test signal, and outputs "1." If both of the outputs from the comparators 11*a* and 11*b* of the input state detection section 11 are "0," then the logic decoder 12*a* determines that "0" is inputted as a test signal, and outputs "0." For example, if the output from the comparator 11*a* is "0" and the output from the comparator 11*b* is "1," then the logic decoder 12*a* determines that the input state detection section 11 is not in a state in which a test signal is inputted, and turns off drivers 14*a* of the driver and comparator sections 14-1 through 14-*n*.

The distribution circuit 12*c* inputs the test signal to the drivers 14*a* of the driver and comparator sections 14-1 through 14-*n*. At this time the distribution circuit 12*c* performs delay adjustment according to, for example, variations in the length of wirings between the signal processing section 12 and the DUTs 30-1 through 30-*n* so that the test signal will be inputted simultaneously to the DUTs 30-1 through 30-*n*. The delay adjustment can be realized, for example, by arranging a plurality of buffer circuits which differ in delay time in the distribution circuit 12*c*.

The logic decoder 12*b* determines from outputs from comparators 14*b* and 14*c* of the driver and comparator sections 14-1 through 14-*n* whether response signals from the DUTs 30-1 through 30-*n* are at a H level or a L level. The comparators 14*b* and 14*c* of the driver and comparator sections 14-1 through 14-*n* compare the response signals from the DUTs 30-1 through 30-*n*, respectively, with thresholds (voltage Vt3 and Vt4) and output comparison results.

The test result synthesis circuit 12*d* synthesizes the levels of the response signals from the DUTs 30-1 through 30-*n* outputted from the logic decoder 12*b*, and outputs a signal obtained as a test result.

The test result output section 13 makes the voltage level of the test result transmitted from the signal processing section 12 differ from the H and L levels of the test signal inputted from the tester 20, and outputs the test result to the tester 20 via the signal line SL.

For example, the test result output section 13 includes a driver 13*a*. The driver 13*a* is controlled by a control signal transmitted from the signal processing section 12. The driver 13*a* outputs a signal according to the inputted test result to the tester 20 via the signal line SL. That is to say, if the test result inputted is, for example, "1," then the driver 13*a* outputs a signal of voltage V1 as the test result to the tester 20 via the signal line SL. If the test result inputted is "0," then the driver 13*a* outputs a signal of voltage V2 as the test result to the tester 20 via the signal line SL. If the test result inputted is "HiZ," then the driver 13*a* is stopped, for example, by the control signal. In this case, a signal of voltage V3 which is applied in advance to the signal line SL and which is a voltage level midway between the voltage V1 and the voltage V2 is outputted as the test result to the tester 20 via the signal line SL.

Figure 3:
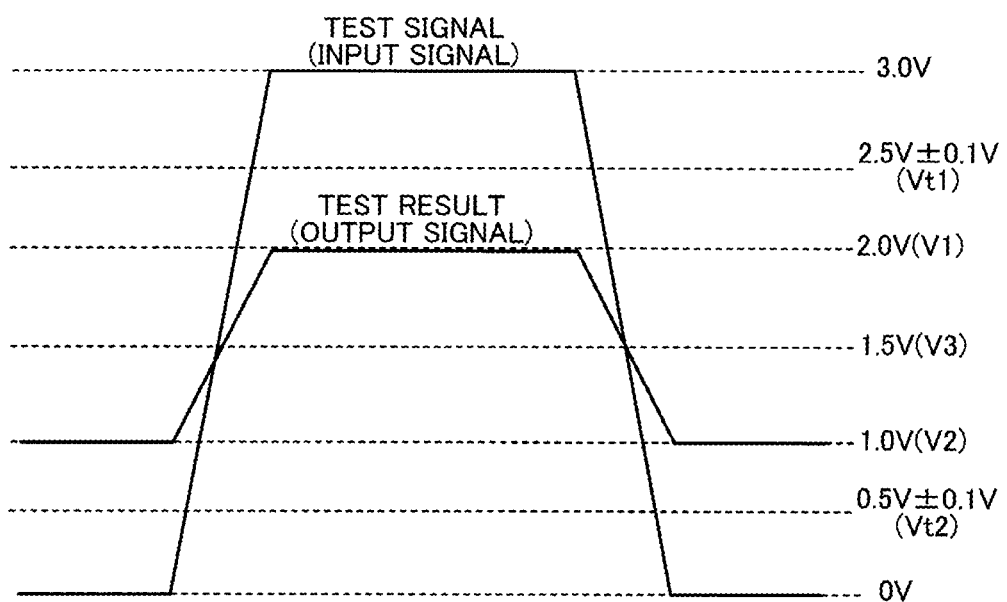
FIG. 3 illustrates an example of the voltage values of a test signal (input signal) and a test result (output signal) and thresholds.

FIG. 3 illustrates an example of the voltage values of the test signal (input signal) and the test result (output signal) and the thresholds.

It is assumed that the H and L levels of the test signal transferred from the pin electronics section 21 of the tester 20 to the signal line SL are, for example, 3.0 V and 0 V respectively. In this case, it is assumed that the thresholds (voltage Vt1 and Vt2) set for the comparators 11a and 11b of the input state detection section 11 are, for example, about 2.5 (±0.1) V and 0.5 (±0.1) V respectively. In addition, the voltage V3 is set to about 1.5 V. The voltage V1 indicative of the test result "1" is set to, for example, about 2.0 V and the voltage V2 indicative of the test result "0" is set to, for example, about 1.0 V. These voltage values are differentiated from the voltage levels corresponding to the H and L levels of the test signal.

The voltage levels of the three test results (output signals) are made in this way to differ from the voltage levels of the two test signals (input signals). By doing so, a differentiation between an input and an output can be made even by the use of the one signal line SL.

As illustrated in FIG. 2, the driver and comparator section 14-1 includes, for example, the driver 14a and the comparators 14b and 14c.

The driver 14a supplies the test signal transmitted from the signal processing section 12 to the DUT 30-1. If the input state detection section 11 is not in a state in which a test signal is inputted, then the driver 14a is turned off by a control signal transmitted from the signal processing section 12.

The voltage V3 is applied to a negative input terminal of the comparator 14b as a threshold and a response signal from the DUT 30-1 is inputted to a positive input terminal of the comparator 14b. For example, if the voltage level of the response signal is higher than the voltage V3, then the comparator 14b outputs "1."

The voltage V4 is applied to a negative input terminal of the comparator 14c as a threshold and the response signal from the DUT 30-1 is inputted to a positive input terminal of the comparator 14c. For example, if the voltage level of the response signal is lower than the voltage V4, then the comparator 14c outputs "0."

The structure of the driver and comparator sections 14-2 through 14-n is almost the same as that of the driver and comparator section 14-1.

The voltage Vt1, Vt2, Vt3, Vt4, V1, V2, V3, and like set in the semiconductor testing circuit 10 are supplied from the voltage supply section 18. For example, a D/A (Digital-to-Analog) converter is used as the voltage supply section 18. By doing so, supplied voltage can be varied and a threshold can be set arbitrarily. The voltage supply section 18 is controlled, for example, by a control signal transmitted from another pin electronics section of the tester 20. The voltage supply section 18 may be placed inside the semiconductor testing circuit 10 or outside the semiconductor testing circuit 10.

As illustrated in FIG. 1, the switch 15 is placed on the signal line SL between the input state detection section 11 and the pin electronics section 21 of the tester 20. In addition, the switch 16 is used for determining which of the DUTs 30-1 through 30-n the pin electronics section 21 of the tester 20 is connected to. The switches 17-1, 17-2, . . . , and 17-n are used for selecting the connection of the driver and comparator sections 14-1 through 14-n to the DUTs 30-1 through 30-n, respectively, or the connection of the DUTs 30-1 through 30-n to routes by which the DUTs 30-1 through 30-n are connected directly to the pin electronics section 21 of the tester 20.

Signals (not illustrated) for controlling the switches 15, 16, and 17-1 through 17-n are inputted from, for example, another pin electronics section of the tester 20.

The operation of the semiconductor testing circuit 10 will now be described.

The operation of the semiconductor testing circuit 10 performed at the time of testing the DUTs 30-1 through 30-n simultaneously will be described first.

When the DUTs 30-1 through 30-n are tested simultaneously, the switch 15 is turned on and the driver and comparator sections 14-1 through 14-n are electrically connected to the DUTs 30-1 through 30-n by the switches 17-1 through 17-n respectively.

Figure 4:
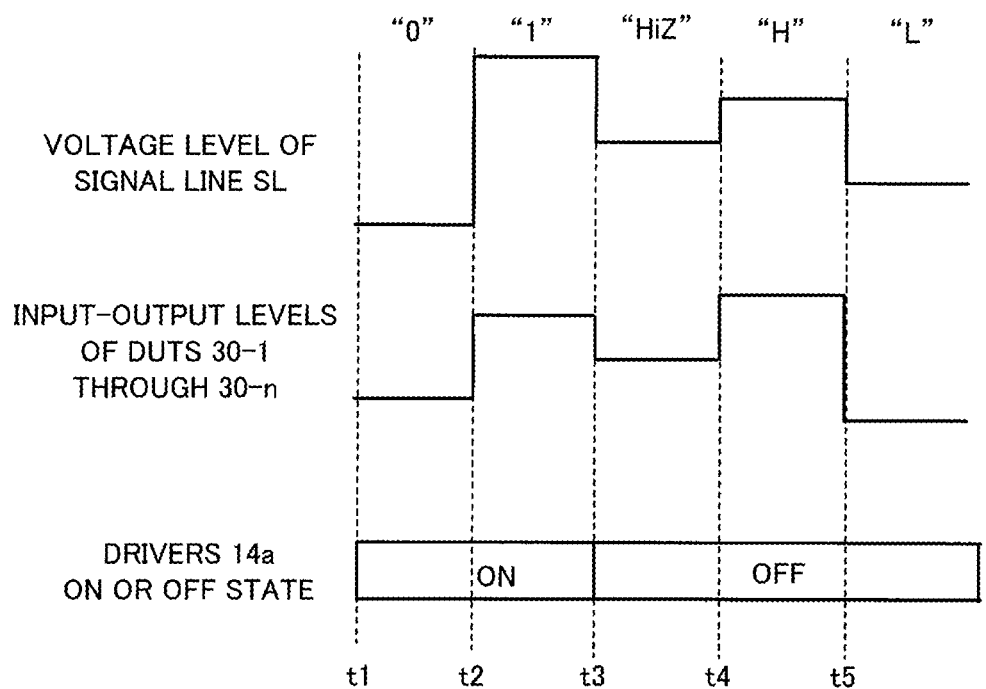
FIG. 4 is a timing chart of the voltage level of a signal line SL, the input-output levels of DUTs, and the on or off state of drivers at normal time.

FIG. 4 is a timing chart of the voltage level of the signal line SL, the input-output levels of the DUTs, and the on or off state of the drivers 14a at normal time.

The levels of inputs to and outputs from the DUTs 30-1 through 30-n indicate the voltage levels of signal lines between the driver and comparator sections 14-1 through 14-n and the DUTs 30-1 through 30-n.

"0" or "1" indicates the value of a test signal inputted from the tester 20. "H" or "L" indicates test results outputted from the DUTs 30-1 through 30-n.

When "0" is inputted from the tester 20 as a test signal (timing t1), the input state detection section and the signal processing section 12 detect the occurrence of the input "0." The signal processing section 12 then turns on all the drivers 14a of the driver and comparator sections 14-1 through 14-n. The signal processing section 12 outputs the test signal "0" to the DUTs 30-1 through 30-n via the driver and comparator sections 14-1 through 14-n. As a result, the input-output levels of the DUTs 30-1 through 30-n become a L level. This L level is determined by the output levels of the drivers 14a.

For example, when "1" is then inputted from the tester 20 as a test signal (timing t2), the input state detection section 11 and the signal processing section 12 detect the occurrence of the input "1." The signal processing section 12 then outputs the test signal "1" to the DUTs 30-1 through 30-n via the driver and comparator sections 14-1 through 14-n. As a result, the input-output levels of the DUTs 30-1 through 30-n become a H level. This H level is determined by the output levels of the drivers 14a.

When the tester 20 then makes the voltage level of the signal line SL "HiZ" (timing t3), the signal processing section 12 determines from an output result of the input state detection section 11 that the input state detection section 11 is not in a state in which a test signal is inputted. The signal processing section 12 then turns off all the drivers 14a of the driver and comparator sections 14-1 through 14-n. By doing so, the input-output levels of the DUTs 30-1 through 30-n also become "HiZ."

Response signals corresponding to the above test signal are then outputted from the DUTs 30-1 through 30-n. The case where all the input-output levels of the DUTs 30-1 through 30-n become, for example, a H level (determined by the output levels of the DUTs 30-1 through 30-n) will be described. In this case, the signal processing section 12 outputs the test result "1" as a value obtained by synthesizing these response signals. On the basis of this test result, the test result output section 13 transmits voltage (voltage V1 indicated in FIG. 3) indicative of the H level to the signal line SL (timing t4). As indicated in FIG. 3, this voltage level differs from a voltage level corresponding to the H level of a test signal recognized as "1."

The case where the response signals corresponding to the above test signal then change and where all the input-output levels of the DUTs 30-1 through 30-n become, for example, a L level (determined by the output levels of the DUTs 30-1 through 30-n) will be described. In this case, the signal processing section 12 outputs the test result "0" as a value obtained by synthesizing these response signals. On the basis of this test result, the test result output section 13 transmits voltage (voltage V2 indicated in FIG. 3) indicative of the L level to the signal line SL (timing t5). As indicated in FIG. 3, this voltage level differs from a voltage level corresponding to the L level of a test signal recognized as "0."

Figure 5:
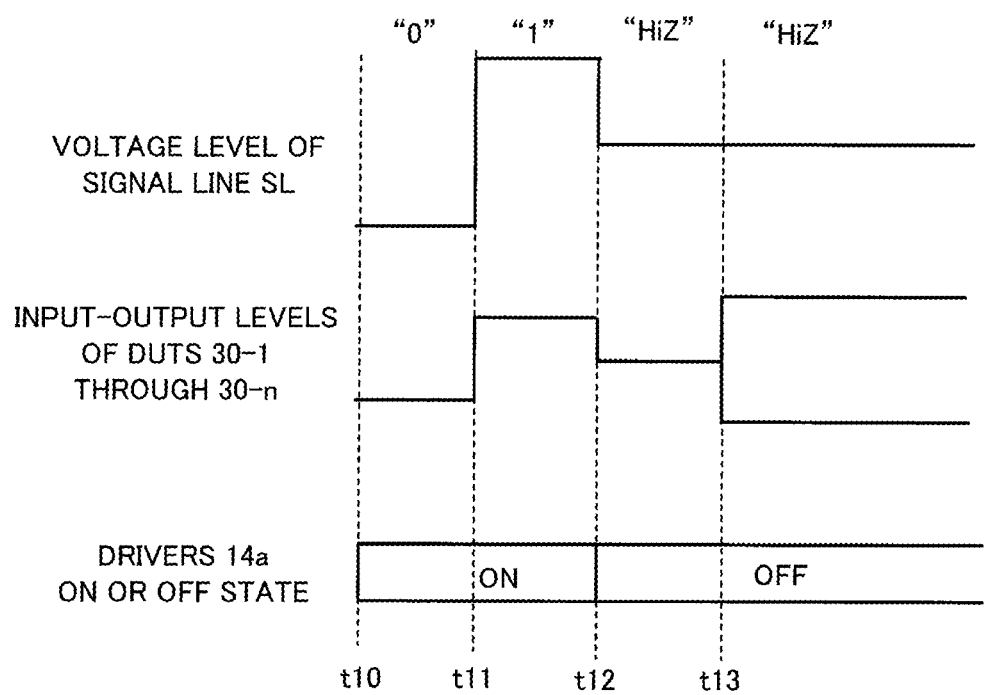
FIG. 5 is a timing chart of the voltage level of the signal line SL, the input-output levels of the DUTs, and the on or off state of the drivers at the time of the occurrence of an abnormality.

FIG. 5 is a timing chart of the voltage level of the signal line SL, the input-output levels of the DUTs, and the on or off state of the drivers 14a at the time of the occurrence of an abnormality.

Processes performed from timing t10 to timing t11 and from timing t11 to timing t12 are the same as those in FIG. 4 performed from timing t1 to timing t2 and from timing t2 to timing t3, respectively. If an abnormality occurs in any of the DUTs 30-1 through 30-n at timing t13 and response signals outputted differ from the rest, then the H levels and the L levels mingle in the input-output levels of the DUTs 30-1 through 30-n. In this case, the signal processing section 12 outputs the test result "HiZ." The voltage level of the signal line SL becomes, for example, the voltage V3 which is indicated in FIG. 3 and which corresponds to "HiZ." As a result, the tester 20 can detect that an abnormality has occurred in at least one of the DUTs 30-1 through 30-n.

With the semiconductor testing circuit 10 according to this embodiment, as has been described, a test signal from the tester 20 is supplied to the DUTs 30-1 through 30-n and a test result obtained by synthesizing response signals corresponding to the test signal is outputted to the tester 20. The voltage level of the test result is different from that of the test signal. As a result, a differentiation between an input and an output can be made by the use of the one signal line SL. Therefore, though each of the DUTs 30-1 through 30-n has input-output terminals, many DUTs can be tested simultaneously. This enables improvement in test throughput and a reduction in test costs and investment in plant and machinery.

In FIG. 1, the tester 20 includes only one pin electronics section 21. However, the tester 20 may include a plurality of pin electronics sections 21 and a plurality of semiconductor testing circuits 10 may be used. By doing so, the number of DUTs simultaneously tested can be increased further.

By the way, as indicated in FIG. 5, the tester 20 may detect that an abnormality has occurred in some of the DUTs 30-1 through 30-n. In this case, DUTs 30 in which an abnormality has occurred can be specified by performing the following process.

If each of the DUTs 30-1 through 30-n is tested, the tester 20 transmits control signals so that the switch will be turned off and so that the switches 17-1 through 17-n will be connected to the routes by which the DUTs 30-1 through 30-n are connected to the pin electronics section 21 via the switch 16. After that, the following process is performed.

Figure 6:
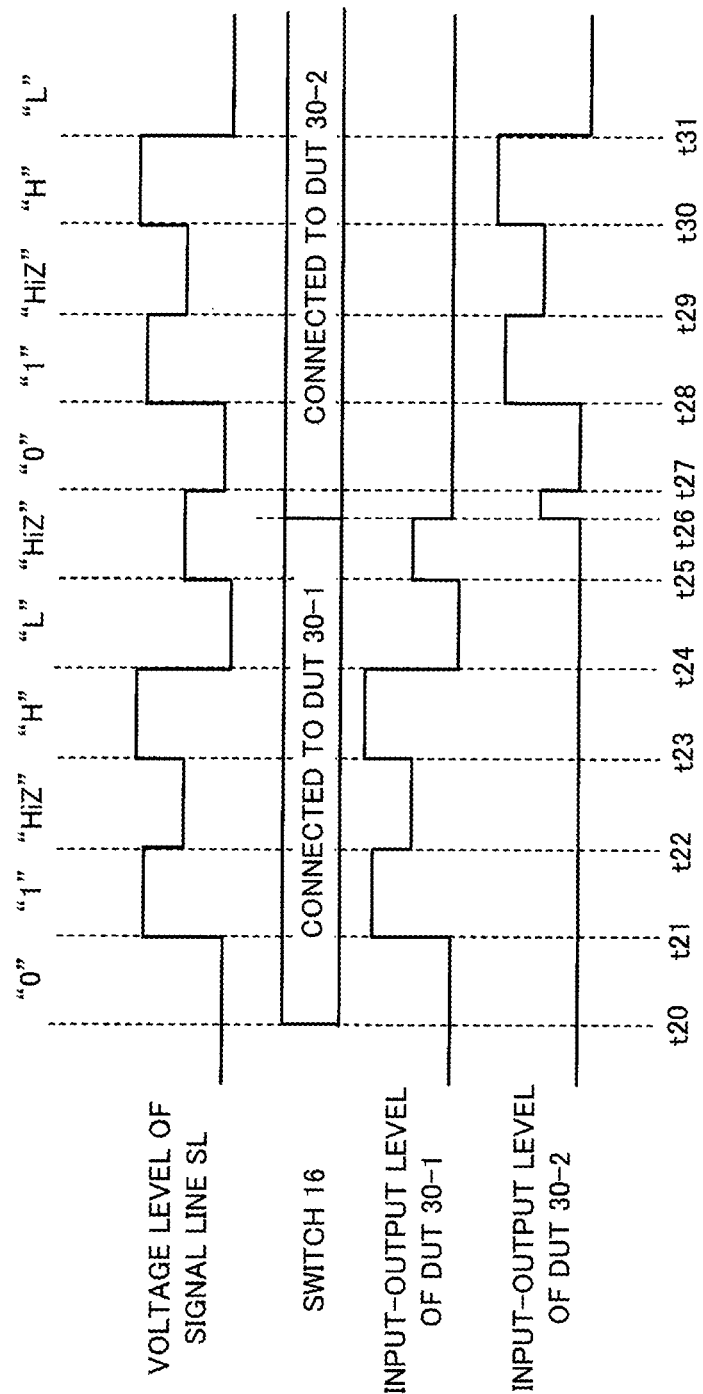
FIG. 6 is a timing chart of how each DUT is tested.

FIG. 6 is a timing chart of how each DUT is tested.

In FIG. 6, the voltage level of the signal line SL, the state of the switch 16, and the input-output levels of the DUTs 30-1 and 30-2 are indicated.

First the switch 16 connects the pin electronics section 21 to the DUT 30-1 by a control signal from the tester 20 in a state in which the test signal "0" is inputted from the tester 20 (timing t20). As a result, the input-output level of the DUT 30-1 becomes equal to the voltage level of the signal line SL and "0" is inputted to the DUT 30-1 as a test signal. When the test signal "1" is then inputted from the tester 20 (timing t21), the input-output level of the DUT 30-1 becomes equal to the voltage level of the signal line SL and "1" is inputted to the DUT 30-1 as a test signal. When the voltage level of the signal line SL is then made "HiZ" by the tester 20 (timing t22), the input-output level of the DUT 30-1 also becomes "HiZ."

When a response signal at the H level corresponding to the test signal is then outputted from the DUT 30-1 (timing t23), the voltage level of the signal line SL also becomes equal to the output level of the DUT 30-1, that is to say, the H level and is detected by the tester 20. When a response signal at the L level corresponding to the test signal is then outputted from the DUT 30-1 (timing t24), the voltage level of the signal line SL also becomes equal to the output level of the DUT 30-1, that is to say, the L level and is detected by the tester 20.

The tester 20 then makes the voltage level of the signal line SL "HiZ" (timing t25) and the switch 16 connects the pin electronics section 21 to the DUT 30-2 by a control signal from the tester 20 (timing t26). As a result, the input-output level of the DUT 30-2 becomes equal to the voltage level of the signal line SL, that is to say, "HiZ."

When the test signal "0" is then inputted from the tester 20 (timing t27), the input-output level of the DUT 30-2 becomes equal to the voltage level of the signal line SL and "0" is inputted to the DUT 30-2 as a test signal. When the test signal "1" is then inputted from the tester 20 (timing t28), the input-output level of the DUT 30-2 becomes equal to the voltage level of the signal line SL and "1" is inputted to the DUT 30-2 as a test signal. When the voltage level of the signal line SL is then made "HiZ" by the tester 20 (timing t29), the input-output level of the DUT 30-2 also becomes "HiZ."

When a response signal at the H level corresponding to the test signal is then outputted from the DUT 30-2 (timing t30), the voltage level of the signal line SL also becomes equal to the output level of the DUT 30-2, that is to say, the H level and is detected by the tester 20. When a response signal at the L level corresponding to the test signal is then outputted from the DUT 30-2 (timing t31), the voltage level of the signal line SL also becomes equal to the output level of the DUT 30-2, that is to say, the L level and is detected by the tester 20.

The above test is repeated on the DUTs 30-3 through 30-n by the use of the semiconductor testing circuit 10. By doing so, the tester 20 can detect some of the DUTs 30-1 through 30-n in which an abnormality has occurred.

The signal processing section 12 may make the supply of a test signal only to a DUT to be tested and the receiving of a response signal only from the DUT to be tested valid. By doing so, each of the DUTs 30-1 through 30-n can be tested.

Figure 7:
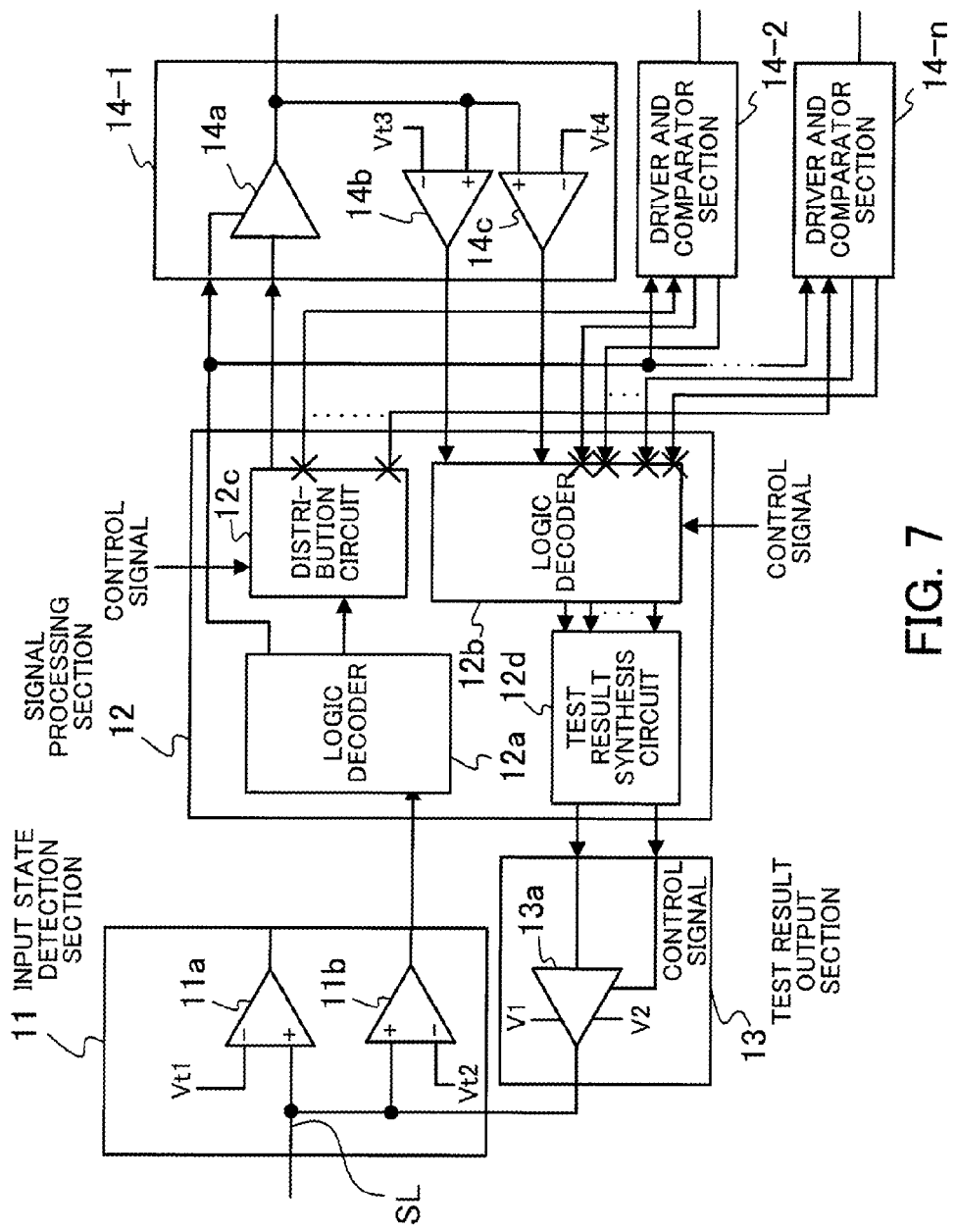
FIG. 7 illustrates how each DUT is tested by the use of a signal processing section.

FIG. 7 illustrates how each DUT is tested by the use of the signal processing section.

As illustrated in FIG. 7, to test, for example, only the DUT 30-1, the distribution circuit 12c of the signal processing section 12 supplies a test signal determined by the logic decoder 12a only to the driver and comparator section 14-1 by a control signal from the tester 20. For example, the distribution circuit 12c negates the supply of the test signal to the other driver and comparator sections 14-2 through 14-n (for example, the distribution circuit 12c keeps a test signal supplied to the other driver and comparator sections 14-2 through 14-n at "HiZ").

The logic decoder 12b also makes a response signal only from the DUT 30-1 (output only from the driver and comparator section 14-1) receivable by a control signal from the tester 20. The logic decoder 12b negates inputs from the other driver and comparator sections 14-2 through 14-n (for example, the logic decoder 12b keeps the inputs from the other driver and comparator sections 14-2 through 14-n at "HiZ").

As a result, the semiconductor testing circuit 10 can test each of the DUTs 30-1 through 30-n without the switch 15, 16, or 17-1 through 17-n.

The semiconductor testing circuit 10 which has been described is mounted, for example, on the following semiconductor testing jigs.

Figure 8:
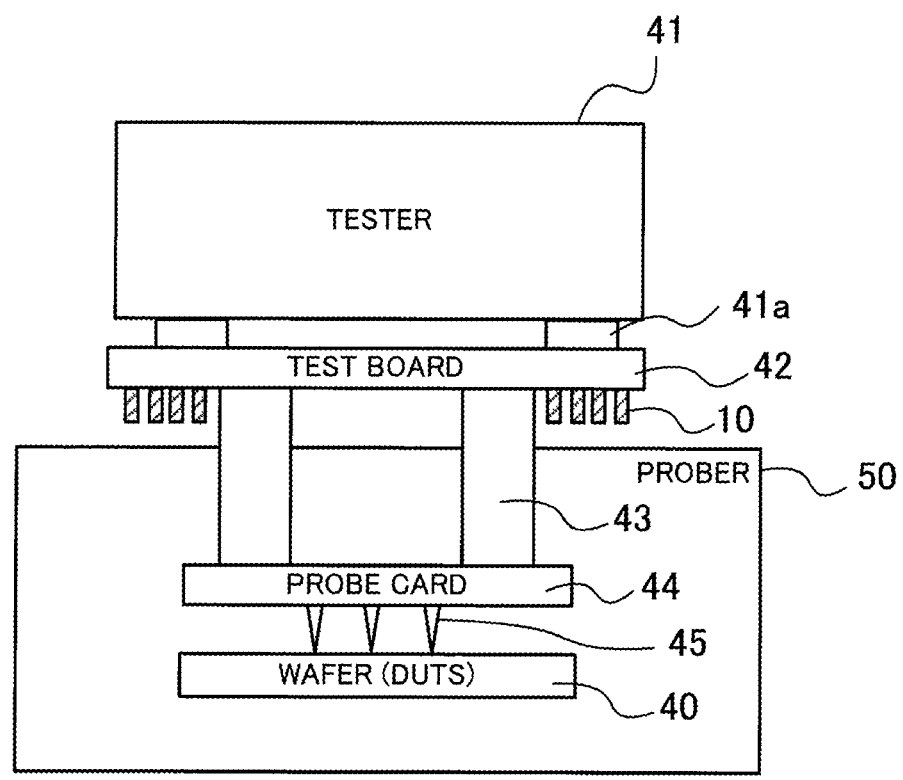
FIG. 8 is a schematic view of how DUTs in a wafer state are tested.

FIG. 8 is a schematic view of how DUTs in a wafer state are tested.

In this example, a plurality of DUTs (not illustrated) formed on a wafer 40 are placed on a prober 50 and are tested. The semiconductor testing circuits 10 illustrated in FIG. 1 are mounted on a test board 42 which is one of semiconductor testing jigs and which is connected to a POGO pin 41a of a tester 41 (corresponding to the pin electronics section 21 illustrated in FIG. 1).

Each semiconductor testing circuit 10 is electrically connected to the tester 41 via a wiring (not illustrated) formed on the test board 42. In addition, each semiconductor testing circuit 10 is electrically connected to a DUT formed on the wafer 40 via a wiring (not illustrated) formed on the test board 42, a frog ring 43, a wiring (not illustrated) formed on a probe card 44, and a probe 45.

Each semiconductor testing circuit 10 tests a plurality of DUTs. When each semiconductor testing circuit 10 receives a test signal from the tester 41, it supplies the test signal to these DUTs. For example, each semiconductor testing circuit 10 supplies the test signal to eight or sixteen DUTs. In addition, each semiconductor testing circuit 10 outputs a test result obtained by synthesizing response signals transmitted from the plurality of DUTs connected thereto to the tester 41. The voltage level of the test result differs from the H and L levels of the test signal.

Figure 9A:
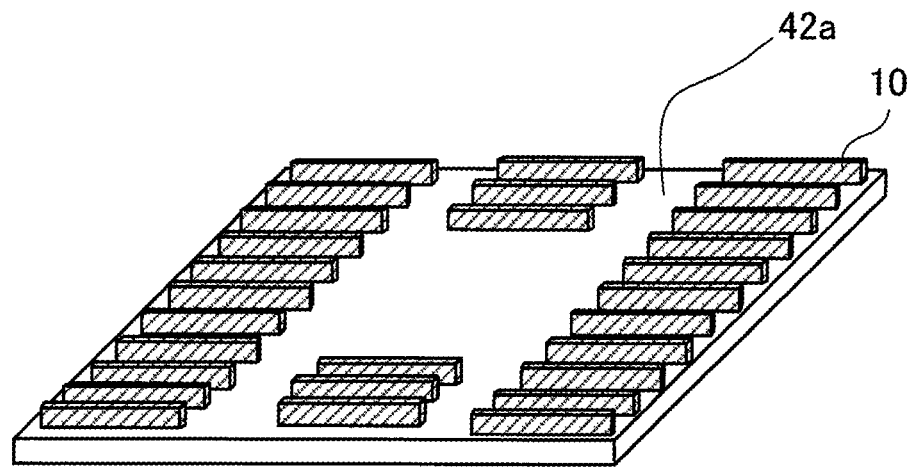
FIGS. 9A and 9B illustrate examples of mounting the semiconductor testing circuits on a test board, FIG. 9A illustrating an example of mounting the semiconductor testing circuits on a test board in the shape of a square, FIG. 9B illustrating an example of mounting the semiconductor testing circuits on a test board in the shape of a disc.
Figure 9B:
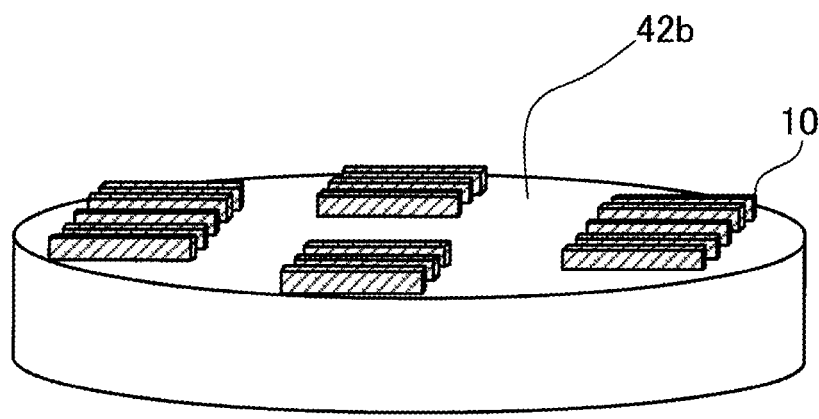

FIGS. 9A and 9B illustrate examples of mounting the semiconductor testing circuits on a test board. FIG. 9A illustrates an example of mounting the semiconductor testing circuits 10 on a test board 42a in the shape of a square. FIG. 9B illustrates an example of mounting the semiconductor testing circuits 10 on a test board 42b in the shape of a disc.

With the test board 42a or 42b the semiconductor testing circuits 10 can be arranged on an area other than an area on which the frog ring 43 illustrated in FIG. 8 is placed.

Many DUTs can be tested simultaneously by mounting the semiconductor testing circuits 10 in this way on the test board 42a or 42b.

Figure 10:
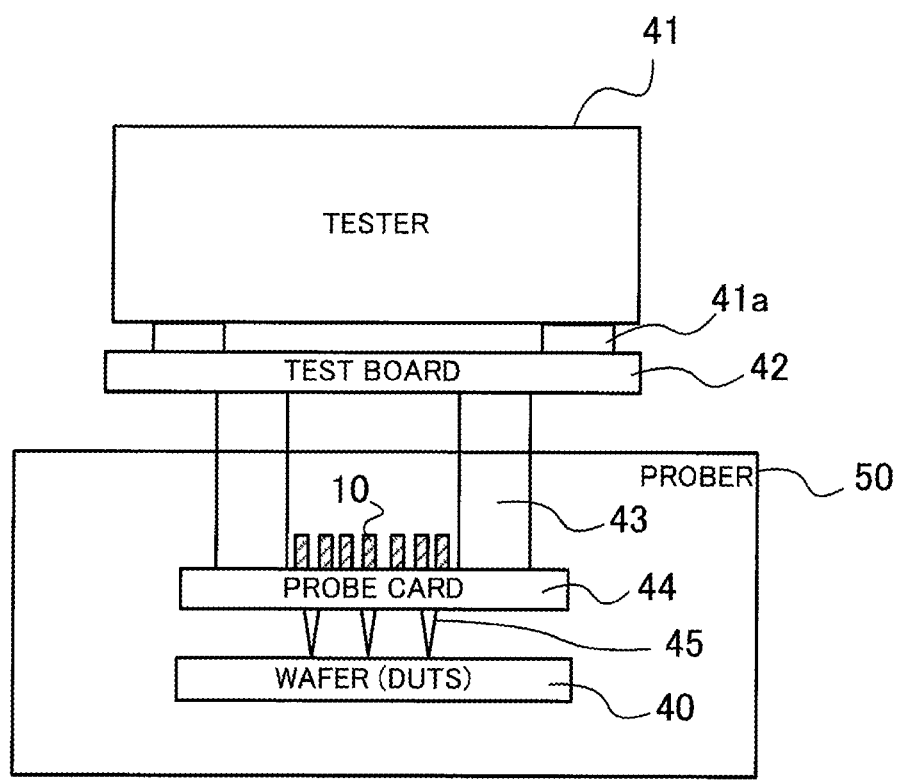
FIG. 10 illustrates another example of mounting the semiconductor testing circuits.

FIG. 10 illustrates another example of mounting the semiconductor testing circuits.

In this example, the semiconductor testing circuits 10 are mounted on the probe card 44 which is one of semiconductor testing jigs.

Figure 11A:
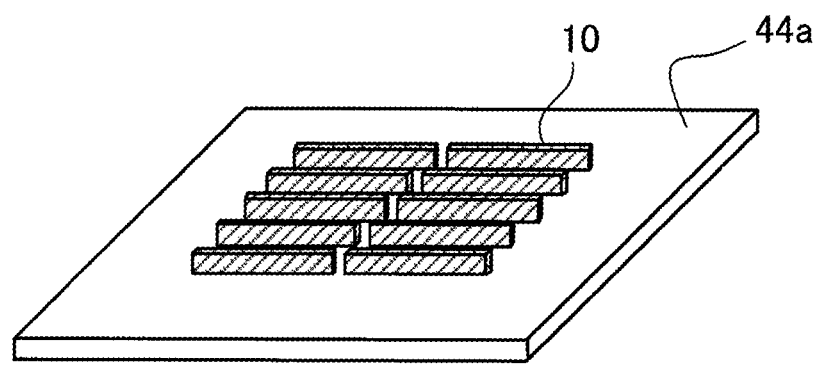
FIGS. 11A and 11B illustrate examples of mounting the semiconductor testing circuits on a probe card, FIG. 11A illustrating an example of mounting the semiconductor testing circuits on a probe card in the shape of a square, FIG. 11B illustrating an example of mounting the semiconductor testing circuits on a probe card in the shape of a disc.
Figure 11B:
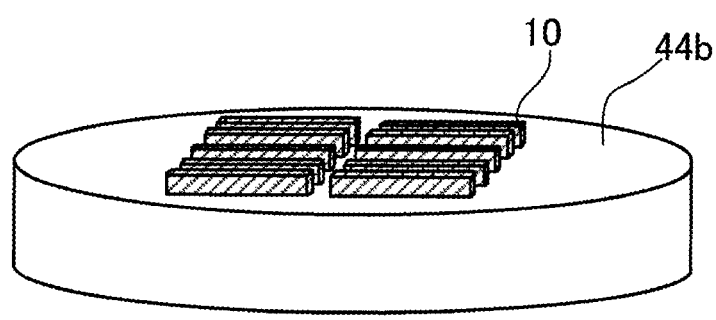

FIGS. 11A and 11B illustrate examples of mounting the semiconductor testing circuits on a probe card. FIG. 11A illustrates an example of mounting the semiconductor testing circuits 10 on a probe card 44a in the shape of a square. FIG. 11B illustrates an example of mounting the semiconductor testing circuits 10 on a probe card 44b in the shape of a disc.

An area of the test board 42 on which the semiconductor testing circuits 10 can be mounted is wider than an area of the probe card 44a or 44b on which the semiconductor testing circuits 10 can be mounted. However, if the semiconductor testing circuits 10 are mounted on the probe card 44a, there is no need to pass a signal line for connecting each semiconductor testing circuit 10 to a plurality of DUTs through the frog ring 43. Therefore, compared with the case where the semiconductor testing circuits 10 are mounted on the test board 42, the number of signal lines passed through the frog ring 43 can be reduced.

Figure 12:
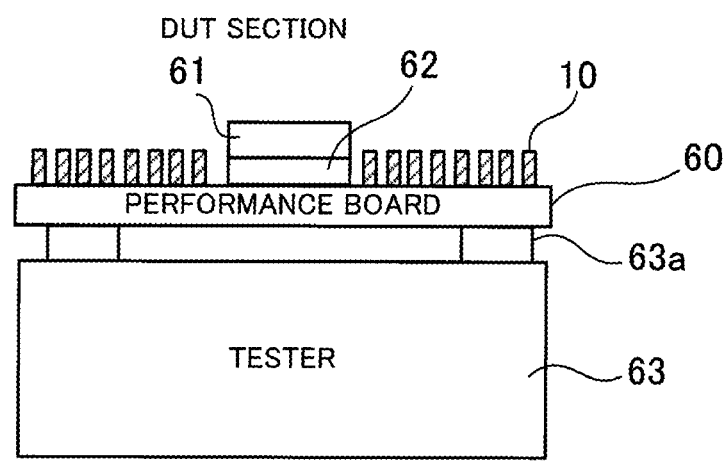
FIG. 12 illustrates how a final test is conducted on DUTs in a package state.

FIG. 12 illustrates how a final test is conducted on DUTs in a package state.

In this example, the semiconductor testing circuits 10 illustrated in FIG. 1 are mounted on a performance board 60 which is one of semiconductor testing jigs, and a final test is conducted.

A DUT section 61 including a plurality of DUTs in a package state is electrically connected to the performance board 60 by a socket section 62. The DUT section 61 is electrically connected to the semiconductor testing circuits 10 via wirings (not illustrated) formed on the performance board 60. The semiconductor testing circuits 10 are connected to a POGO pin 63a of a tester 63 via wirings (not illustrated) formed on the performance board 60.

Figure 13:
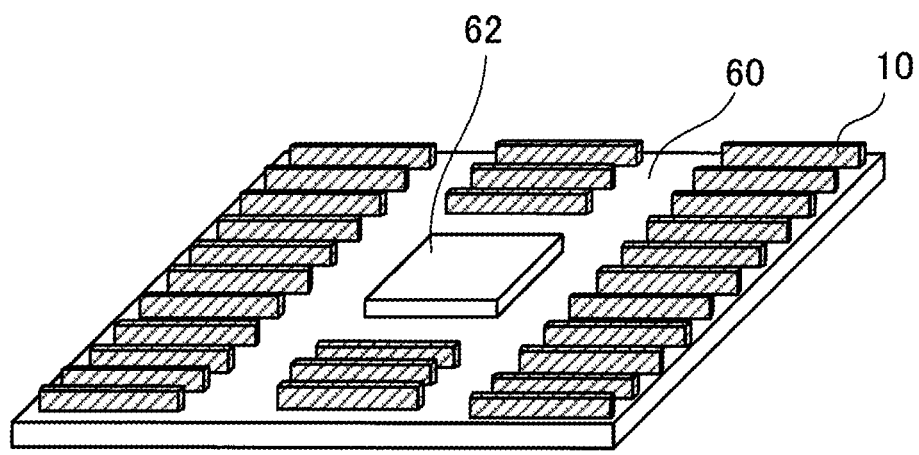
FIG. 13 illustrates an example of mounting the semiconductor testing circuits on a performance board.

FIG. 13 illustrates an example of mounting the semiconductor testing circuits on a performance board.

As illustrated in FIG. 13, for example, the semiconductor testing circuits 10 can be arranged on an area around the socket section 62.

As has been described, many DUTs can be tested simultaneously by arranging the semiconductor testing circuits 10 on a semiconductor testing jig.

The semiconductor testing circuits 10 may be mounted in a tester.

Figure 14:
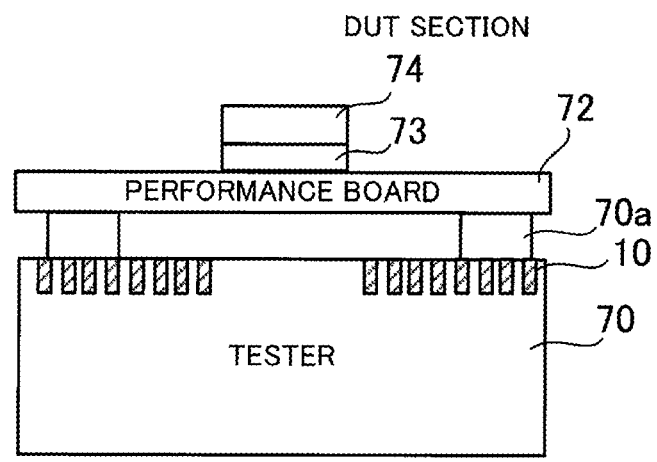
FIG. 14 illustrates another example of mounting the semiconductor testing circuits.

FIG. 14 illustrates another example of mounting the semiconductor testing circuits.

In this example, the semiconductor testing circuits 10 are mounted in a tester 70 and function as one semiconductor testing apparatus. For example, the semiconductor testing circuits 10 are mounted in the tester 70 by embedding them in a test head section.

A test signal supplied from each semiconductor testing circuit 10 is transmitted to a performance board 72 via a POGO pin 70a and is supplied to a plurality of DUTs on a DUT section 74 via a socket section 73. Response signals from the plurality of DUTs are supplied to each semiconductor testing circuit 10 via the socket section 73, the performance board 72, and the POGO pin 70a and are synthesized. A test result is then outputted from each semiconductor testing circuit 10 and is discriminated inside the tester 70. The voltage level of the test result differs from the H and L levels of the test signal inputted from the inside of the tester 70 to each semiconductor testing circuit 10.

Many DUTs can be tested simultaneously by mounting the semiconductor testing circuits 10 in this way in the tester 70. In addition, there is no need to prepare a plurality of semiconductor testing jigs on which the semiconductor testing circuits 10 are mounted according to the number of DUTs. This increases the versatility.

According to the disclosed semiconductor testing circuit, a semiconductor testing jig, a semiconductor testing apparatus, and a semiconductor testing method, many DUTs can be tested simultaneously.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor testing circuit comprising:
   a signal processing section which receives a test signal from a tester via a signal line and supplies the test signal to a plurality of devices under test and which generates a test result by synthesizing response signals transmitted from the plurality of devices under test on the basis of the test signal; and a test result output section which changes, based on a voltage value of the test result, the voltage value to be an output voltage value different from the voltage value of the test signal and which outputs an output test result with the output voltage value to the tester via the signal line.

2. The semiconductor testing circuit according to claim 1, wherein the output voltage value is equal to one of three voltage values different from a first voltage value of the test signal and a second voltage value of the test signal.

3. The semiconductor testing circuit according to claim 1, further comprising:
   an input state detection section which
   compares a voltage value of the test signal of the signal line with a third voltage value, and
   detects whether the input state detection section is in a state in which the test signal is inputted.

4. The semiconductor testing circuit according to claim 1, wherein if the test result indicates the occurrence of an abnormality in at least one of the plurality of devices under test, the signal processing section supplies the test signal to each of the plurality of devices under test at different timing, stops the synthesizing of the response signals transmitted from the plurality of devices under test, and outputs the response signals to the tester at different timing.

5. The semiconductor testing circuit according to claim 1, further comprising a voltage supply section which adjusts the voltage value of the test result output from the test result output section.

6. The semiconductor testing circuit according to claim 1, wherein the signal processing section supplies the test signal to the plurality of devices under test at first timing, and receives the response signals from the plurality of devices under test at second timing.

7. A semiconductor testing jig including semiconductor testing circuits each comprising:
   a signal processing section which receives a test signal from a tester via a signal line and supplies the test signal to a plurality of devices under test and which generates a test result by synthesizing response signals transmitted from the plurality of devices under test on the basis of the test signal; and
   a test result output section which changes, based on a voltage value of the test result, the voltage value to be an output voltage value different from the voltage value of the test signal and which outputs an output test result with the output voltage value to the tester via the signal line.

8. A semiconductor testing apparatus including semiconductor testing circuits each comprising:
   a signal processing section which receives a test signal via a signal line and supplies the test signal to a plurality of devices under test and which generates a test result by synthesizing response signals transmitted from the plurality of devices under test on the basis of the test signal; and
   a test result output section which changes, based on a voltage value of the test result, the voltage value to be an output voltage value different from the voltage value of the test signal and which outputs an output test result with the output voltage value via the signal line.

9. A semiconductor testing method comprising:
receiving a test signal from a tester via a signal line;
supplying the test signal to a plurality of devices under test;
generating a test result by synthesizing response signals transmitted from the plurality of devices under test on the basis of the test signal; and
changing, based on a voltage value of the test result, the voltage value to be an output voltage value different from the voltage value of the test signal and outputting an output test result with the output voltage value to the tester via the signal line.

* * * * *